US010032932B2

(12) United States Patent
Kim et al.

(10) Patent No.: US 10,032,932 B2
(45) Date of Patent: Jul. 24, 2018

(54) OXIDE THIN-FILM TRANSISTOR AND METHOD OF FABRICATING THE SAME

(71) Applicant: INDUSTRY-ACADEMIC COOPERATION FOUNDATION, YONSEI UNIVERSITY, Seoul (KR)

(72) Inventors: Hyun Jae Kim, Seoul (KR); Jae Won Na, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 15/423,842

(22) Filed: Feb. 3, 2017

(65) Prior Publication Data
US 2017/0229586 A1    Aug. 10, 2017

(30) Foreign Application Priority Data
Feb. 4, 2016   (KR) .................. 10-2016-0014219
Jan. 23, 2017  (KR) .................. 10-2017-0010386

(51) Int. Cl.
| H01L 29/49 | (2006.01) |
| H01L 29/66 | (2006.01) |
| H01L 29/78 | (2006.01) |
| H01L 29/51 | (2006.01) |
| H01L 29/786 | (2006.01) |
| H01L 29/24 | (2006.01) |

(52) U.S. Cl.
CPC ........ *H01L 29/78696* (2013.01); *H01L 29/24* (2013.01); *H01L 29/4908* (2013.01); *H01L 29/66969* (2013.01); *H01L 29/7869* (2013.01); *H01L 29/78618* (2013.01); *H01L 29/78621* (2013.01)

(58) Field of Classification Search
CPC .......... H01L 29/78696; H01L 29/7869; H01L 29/66969; H01L 29/24; H01L 29/51; H01L 29/4908; H01L 29/78606; H01L 21/02554; H01L 21/02565; H01L 21/02664; H01L 29/66742; H01L 29/78618; H01L 21/324; H01L 27/1225; H01L 27/3262; H01L 21/30604; H01L 2924/13069; H01L 29/42384; H01L 27/15
USPC ......................................................... 257/43
See application file for complete search history.

(56) References Cited

U.S. PATENT DOCUMENTS 8,278,140 B2    10/2012  Yang et al.
2013/0285054 A1*  10/2013  Moriguchi .......... H01L 27/1225
                                                     257/43

FOREIGN PATENT DOCUMENTS

KR     10-1095993 B1    12/2011

* cited by examiner

*Primary Examiner* — Caleen Sullivan
(74) *Attorney, Agent, or Firm* — Sughrue Mion, PLLC

(57) ABSTRACT

Disclosed are an oxide thin-film transistor and a method of fabricating the same. The oxide thin-film transistor according to an embodiment of the present disclosure includes a gate electrode formed on a substrate; a gate insulating layer formed on the gate electrode; and an oxide thin film formed on the gate insulating layer, wherein the oxide thin film include a channel region, source region and drain regions disposed on the channel region and spaced apart from each other, and a concentration profile due to a dopant diffused from the gate insulating layer, wherein the channel region operates as a channel layer by the concentration profile.

11 Claims, 15 Drawing Sheets

OXIDE THIN-FILM TRANSISTOR AND METHOD OF FABRICATING THE SAME

CROSS-REFERENCE TO RELATED APPLICATION

This application claims the priority benefit of Korean Patent Application No. 10-2016-0014219, filed on Feb. 4, 2016, and Korean Patent Application No. 10-2017-0010386, filed on Jan. 23, 2017, in the Korean Intellectual Property Office, the disclosure of which is incorporated herein by reference.

BACKGROUND OF THE DISCLOSURE

Field of the Disclosure

The present disclosure relates to an oxide thin-film transistor and a method of fabricating the same.

Description of the Related Art

Flat panel displays (FPDs) are very thin and lightweight, and have a very high share in the display market. As the market share of FPDs increases, large-screen and high-definition FPDs are required. Furthermore, in order to apply FPDs to lightweight, thin, flexible and foldable displays, a backplane technology capable of processing at a low temperature and having excellent electrical and mechanical properties and ensuring operational stability is required.

A switching device or driving device used as the backplane of a display includes a silicon (Si)-based thin-film transistor (TFT) using amorphous silicon (a-Si) or polysilicon (poly-Si), and an oxide semiconductor thin-film transistor.

An amorphous silicon (a-Si) thin-film transistor, one type of silicon (Si)-based thin-film transistor, is easy to fabricate, but has low electron mobility. On the other hand, compared to an amorphous silicon (a-Si) thin-film transistor, a polysilicon (poly-Si) thin-film transistor has high electron mobility and therefore can be applied to a high-definition display with a large screen, and is excellent in terms of safety. However, in fabricating a polysilicon (poly-Si) thin-film transistor, there are problems in that the process is complicated and costly, and a compensating circuit is required due to the non-uniform characteristics of elements in a panel.

To solve these disadvantages of silicon (Si)-based thin-film transistors, oxide semiconductor thin-film transistors are being developed. Compared to conventional amorphous silicon (a-Si) thin-film transistors, oxide thin-film transistors are attracting considerable attention as driving elements for next generation displays because of high electron mobility and low leakage current thereof.

An oxide semiconductor used as the channel layer region of an oxide thin-film transistor can be broadly fabricated by two methods. First, there is a method of physically or chemically depositing an oxide semiconductor on a substrate using vacuum equipment. However, this method has a disadvantage of high production costs.

As a method for overcoming such disadvantage, there is a method of forming an oxide semiconductor using a chemical solution deposition process. However, despite an advantage of lowering production costs, an oxide thin-film transistor fabricated by a chemical solution deposition process has a disadvantage in that electrical properties are poor compared with a thin-film transistor fabricated by a vacuum process.

Therefore, there is a need to develop a method of fabricating an oxide semiconductor that is based on a chemical solution deposition process and can improve electrical properties while reducing production costs.

RELATED DOCUMENTS

Patent Documents

Korean Patent No. 10-1095993 (Dec. 13, 2011), "METHOD OF ETCHING OXIDE"

U.S. Pat. No. 8,278,140 (Oct. 2, 2012), "METHOD FOR PREPARING IGZO PARTICLES AND METHOD FOR PREPARING IGZO FILM BY USING THE IGZO PARTICLES"

SUMMARY OF THE DISCLOSURE

Therefore, the present invention has been made in view of the above problems, and it is one object of the present invention to provide an oxide thin-film transistor having an oxide thin film thereon by a chemical solution deposition process to reduce production costs.

It is another object of the present invention to provide an oxide thin-film transistor including a semiconductorized channel layer by selectively etching an oxide thin film to provide improved electrical characteristics.

It is another object of the present invention to provide an oxide thin-film transistor facilitating control of the thickness of a channel layer by selectively etching an oxide thin film.

It is yet another object of the present invention to provide an oxide thin-film transistor having a high film density due to an oxide thin film thereof including multi stacks and thus providing improved electrical characteristics.

In accordance with an aspect of the present invention, the above and other objects can be accomplished by the provision of an oxide thin-film transistor, including a gate electrode formed on a substrate; a gate insulating layer formed on the gate electrode; and an oxide thin film formed on the gate insulating layer, wherein the oxide thin film include a channel region, source region and drain regions disposed on the channel region and spaced apart from each other, and a concentration profile due to a dopant diffused from the gate insulating layer, wherein the channel region operates as a channel layer by the concentration profile.

In the oxide thin-film transistor according to an embodiment of the present disclosure, the channel region may be distinguished from the source and drain regions and formed by selective etching to include the concentration profile so as to function as the channel layer.

The oxide thin film may have a well-shaped recessed pattern by the selective etching.

The thickness of the channel layer of the oxide thin film may be controlled through control of the concentration profile by the selective etching.

In the oxide thin-film transistor according to an embodiment of the present disclosure, the concentration profile may include a concentration gradient from the substrate to an upper part.

In the oxide thin-film transistor according to an embodiment of the present disclosure, the gate insulating layer may be silicon dioxide ($SiO_2$) and the dopant is silicon (Si).

In the oxide thin-film transistor according to an embodiment of the present disclosure, the oxide thin film may include multi stacks formed of at least one oxide layer.

In the oxide thin-film transistor according to an embodiment of the present disclosure, the oxide thin film may be formed of any one selected from the group consisting of InO, ZnO, SnO, InZnO, InGaO, ZnSnO, InSnZnO, and InGaZnO.

In the oxide thin-film transistor according to an embodiment of the present disclosure, the oxide thin film may be formed on the substrate, followed by annealing.

In accordance with another aspect of the present invention, there is provided An oxide thin-film transistor, including: a gate electrode formed on a substrate; a gate insulating layer formed on the gate electrode; an oxide thin film formed on the gate insulating layer; and source and drain electrodes disposed on the oxide thin film and spaced apart from each other, wherein the oxide thin film includes a channel region and a concentration profile due to a dopant diffused from the gate insulating layer, wherein the channel region functions as a channel layer by the concentration profile.

In accordance with another aspect of the present invention, there is provided a method of fabricating an oxide thin-film transistor, the method including: forming a gate electrode on a substrate; forming a gate insulating layer on the gate electrode; forming an oxide thin film on the gate insulating layer; and forming a channel region, and source and drain regions to be spaced apart from each other on the channel region, by selectively etching the oxide thin film, wherein the oxide thin film includes a concentration profile due to a dopant diffused from the gate insulating layer by the selective etching, wherein the channel region functions as a channel layer by the concentration profile.

In accordance with yet another aspect of the present invention, there is provided a method of fabricating an oxide thin-film transistor, the method including: forming a gate electrode on a substrate; forming a gate insulating layer on the gate electrode; forming an oxide thin film on the gate insulating layer; forming source and drain electrodes on the oxide thin film; and forming a channel region by selectively etching the oxide thin film, wherein the oxide thin film includes a concentration profile due to a dopant diffused from the gate insulating layer by the selective etching, wherein the channel region functions as a channel layer by the concentration profile.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Hereinafter, the embodiments of the present invention are described with reference to the accompanying drawings and the description thereof but are not limited thereto.

The terminology used in the present disclosure serves the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "includes" and/or "including," when used in this specification, specify the presence of stated features, steps, operations, elements, and/or components, but do not preclude the presence or addition of one or more other features, steps, operations, elements, components, and/or groups thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

Further, as used in the description of the invention and the appended claims, the singular forms "a", "an" and "the" are intended to include the plural forms as well, unless context clearly indicates otherwise.

In addition, when an element such as a layer, a film, a region, and a constituent is referred to as being "on" another element, the element can be directly on another element or an intervening element can be present.

The present disclosure relates to an oxide thin-film transistor and a method of fabricating the same, and more particularly to an oxide thin-film transistor including a semiconductorized channel layer due to selective etching of an oxide thin film fabricated by a chemical solution deposition process, and a method of fabricating the same.

Hereinafter, referring to FIG. 1, the oxide thin-film transistor according to an embodiment of the present disclosure and the method of fabricating the same are described.

Figure 1:
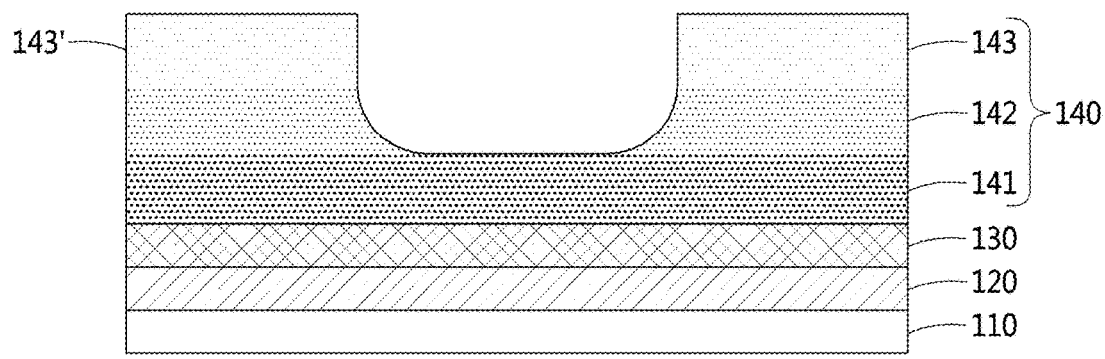
FIG. 1 illustrates a sectional view of an oxide thin-film transistor according to an embodiment of the present disclosure.

FIG. 1 illustrates a sectional view of an oxide thin-film transistor according to an embodiment of the present disclosure.

Referring to FIG. 1, an oxide thin-film transistor 100 according to an embodiment of the present disclosure includes a substrate 110, a gate electrode 120 formed on the substrate 110, a gate insulating layer 130 formed on the gate electrode 120, and an oxide thin film 140 formed on the gate insulating layer 130.

The substrate 110 is a base for forming the oxide thin-film transistor 100 and a material thereof is not specifically limited so long as the material is generally used in the art. The substrate 110 may be made of, for example, various materials such as silicon, glass, plastic, or metal foil. In the case of silicon, a substrate wherein a silicon oxide layer is formed on a surface of silicon may be used.

The gate electrode 120 is formed on the substrate 110. As the gate electrode 120, an electrically conductive material, a metal or a metal oxide, may be used. The gate electrode 120 may be made of, for example, a metal such as Al, Cr, Au, Ti, or Ag, a metal oxide such as Indium Tin Oxide (ITO), Iridium Zinc Oxide (IZO), or Iridium Tin Zinc Oxide (ITZO), or a mixture thereof.

The gate insulating layer 130 is formed on the gate electrode 120. The gate insulating layer 130 may be made of an insulating material used in a general semiconductor process. The gate insulating layer 130 may be made of, for example, a high-K material, such as $HfO_2$, $Al_2O_3$, $ZrO_2$, or $Si_3N_4$ or a mixture thereof, having higher permittivity than $SiO_2$ and $SiO_2$.

The oxide thin film 140 is formed on the gate insulating layer 130. In particular, the oxide thin film 140 may be formed on the substrate 110, on which the gate electrode 120 and the gate insulating layer 130 are formed, by a chemical solution deposition process. More particularly, the oxide thin film 140 may be formed by coating an oxide-containing solution on the substrate 110 on which the gate electrode 120 and the gate insulating layer 130 are formed.

The oxide thin film 140 may include a channel region 141, and source and drain regions 143 and 143' formed on the channel region 141 and spaced apart from each other. The oxide thin film 140 may include a concentration profile due to a dopant diffused from the gate insulating layer 130.

In particular, the oxide thin film 140 may include a concentration profile having a concentration gradient from the substrate 110 to an upper part due to a dopant diffused from the gate insulating layer 130.

The concentration gradient may be characterized in that the concentration of the dopant increases from the substrate 110 to an upper part. For example, the concentration of the dopant of the oxide thin film 140 may be decreased in an order of the lower layer 141>the intermediate layer 142>the upper part layer 143.

The channel region 141 may function as a channel layer by the concentration profile due to the dopant. In particular, the channel region 141 may include a concentration profile wherein the concentration of the dopant diffused from the gate insulating layer 130 in the channel region 141 is high compared to the source and drain regions 143 and 143'. In addition, due to such a high dopant concentration of the channel region 141, the channel region 141 has semiconductor characteristics and thus may function as a channel layer.

In accordance with an embodiment, the gate insulating layer 130 is formed of silicon dioxide ($SiO_2$). Here, the dopant may be silicon (Si).

The channel region 141 may be formed by selective etching. In particular, the channel region 141 may be formed by selective etching to be distinguished from the source and drain regions 143 and 143' and include the concentration profile such that the channel region 141 functions as the channel layer. The selective etching is described referring to FIGS. 2A to 2C below.

The oxide thin film 140 may have a well-shaped recessed pattern by the selective etching. In particular, the oxide thin film 140 has a well-shaped recessed pattern, the channel region 141 forms a lower layer thereof, and the source and drain regions 143 and 143' form an upper layer thereof. In addition, the intermediate region 142 may be disposed between the channel region 141 and the source and drain regions 143 and 143' and may form an intermediate layer.

The thickness of the channel layer of the oxide thin film 140 may be controlled through control of the concentration profile by the selective etching. In particular, an etching degree of the oxide thin film 140 increases as the time of the selective etching increases, whereby the thickness of the channel layer may be reduced. When the thickness of the channel layer is reduced, the dopant concentration in the channel layer may be further increased. Accordingly, the electrical conductivity of the oxide thin film may be decreased.

The oxide thin film 140 may include multi stacks formed of at least one oxide layer. In particular, the oxide thin film 140 may include multi stacks formed of a predetermined number of oxide layers so as to secure a sufficient thickness. When the oxide thin film 140 includes multi stacks, pores and pinholes are decreased and thus a high film density is provided. Accordingly, electrical conductivity sufficient for use as an oxide thin-film transistor may be provided.

The oxide thin film 140 may be made of any one selected from the group consisting of InO, ZnO, SnO, InZnO, InGaO, ZnSnO, InSnZnO and InGaZnO, but the present invention is not limited thereto.

In the case of the oxide thin-film transistor 100 according to an embodiment of the present disclosure, off current is decreased and thus the characteristics of high current are exhibited. Accordingly, the electrical characteristics of a device may be improved.

Hereinafter, referring to FIGS. 2A to 2C, a method of fabricating the oxide thin-film transistor according to an embodiment of the present disclosure is described.

Figure 2A:
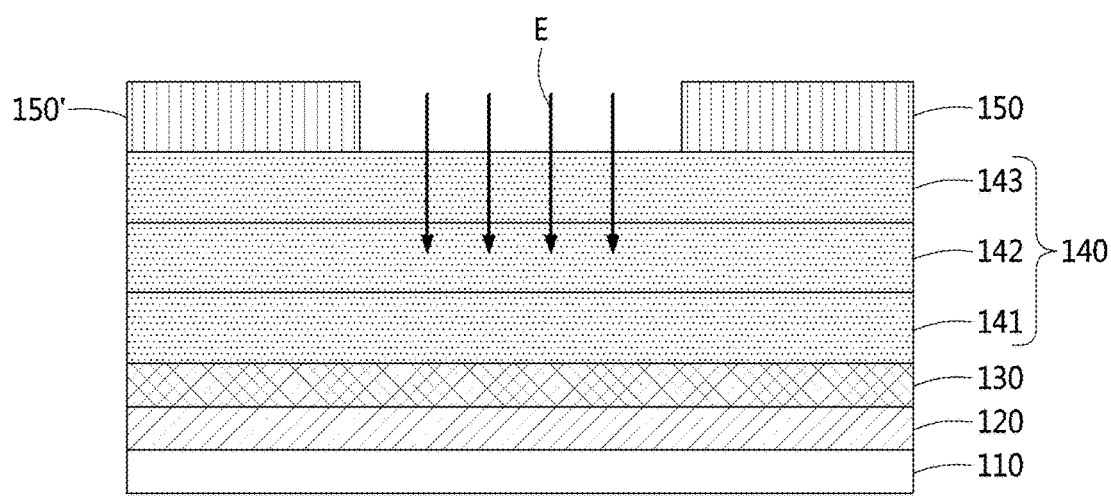
FIGS. 2A to 2C illustrate schematic diagrams of a selective etching process of an oxide thin-film transistor according to an embodiment of the present disclosure.
Figure 2B:
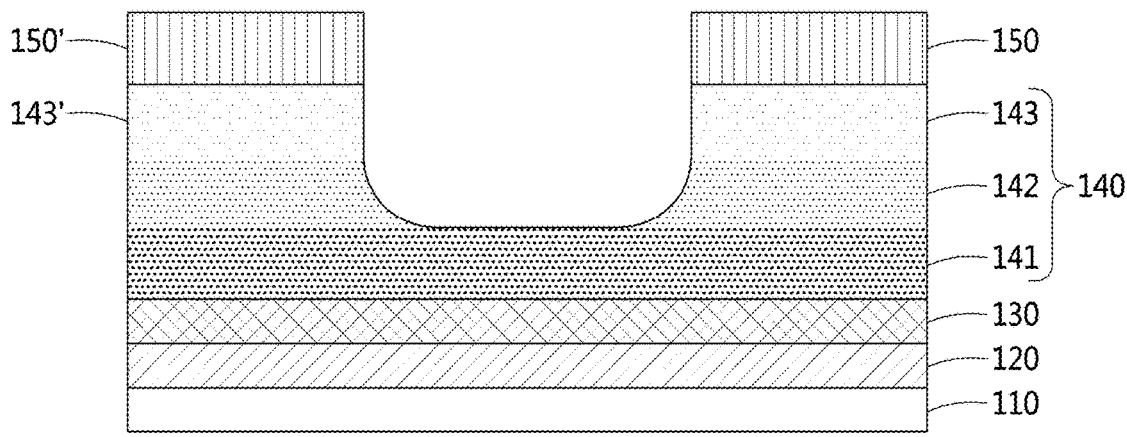
Figure 2C:
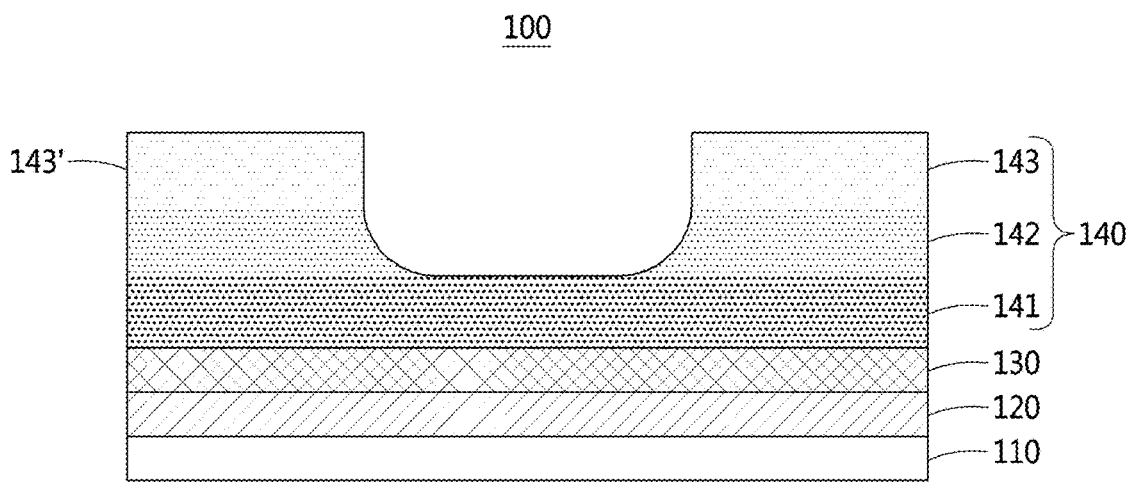

FIGS. 2A to 2C illustrate schematic diagrams of a selective etching process of an oxide thin-film transistor according to an embodiment of the present disclosure.

Referring to FIG. 2A, the oxide thin film 140 may be formed on the substrate 110 by a chemical solution deposition process. In particular, the oxide thin film 140 may be formed by coating an oxide-containing solution on the substrate 110 on which the gate electrode 120 and the gate insulating layer 130 are formed.

The oxide-containing solution may be, for example, a solution containing an oxide precursor for forming an oxide thin film, such as InO, ZnO, SnO, InZnO, InGaO, ZnSnO, InSnZnO, or InGaZNo. The oxide precursor may include, for example, $In(NO_3)_3H_2O$, $Ga(NO_3)_3H_2O$, $Zn(CH_3COO)_2$ $H_2O$, or the like, but the present invention is not limited thereto. For example, the oxide-containing solution may include indium (In) and zinc (Zn) in a mole ratio of 9:3.

A method of coating the oxide-containing solution is not specifically limited so long as the method is used in the art. For example, the method may be spin coating, spray coating, inkjet coating, slit coating, dip coating, or the like. Preferably, a spin coating method is used.

A spin coating method, which is a method most generally used in the art, is characterized by dropping a predetermined amount of solution on a substrate and then rotating the substrate at a high speed such that the substrate is coated by centrifugal force applied to the solution.

The oxide thin film 140 may be formed by spin coating an oxide-containing solution on the substrate 110 on which the gate electrode 120 and the gate insulating layer 130 are formed.

According to an embodiment of the present disclosure, since the oxide thin film 140 is formed by a chemical solution deposition process such as spin coating, production costs may be reduced compared to a deposition process.

The oxide thin film 140 may include multi stacks composed of at least one oxide layer. In particular, the oxide thin film 140 may be formed of multi stacks composed of a plurality of oxide layers by repeating an oxide thin film formation process. When the oxide thin film 140 is formed of the plurality of oxide layers, the thickness of the oxide thin film 140 may increase with increasing oxide layer number.

The oxide thin film 140 may be a three-layered oxide thin film composed of first, second, and third oxide layers 141, 142, and 143 formed by repeating an oxide thin film formation process, as illustrated in FIG. 2A.

One oxide layer may have, for example, a thickness of 1 nm to 50 nm, preferably a thickness of 1 nm to 10 nm, more preferably a thickness of 1 nm to 5 nm.

When the oxide thin film is formed in three layers, a total thickness of the three-layered oxide thin film may be, for example, 3 nm to 150 nm, preferably 3 nm to 30 nm, more preferably 3 nm to 15 nm. In addition, the thicknesses of the respective layers may be different.

The oxide thin film 140 may be formed on the substrate 110 on which the gate electrode 120 and the gate insulating layer 130 are formed by coating with an oxide-containing solution, followed by annealing. When the oxide thin film 140 is annealed, the concentration of oxygen vacancies in the oxide thin film increases and thus the concentration of electrons increases, whereby electrical conductivity of the oxide thin film may be increased.

The annealing may be performed, for example, at 300° C. to 500° C. for 30 minutes to 3 hours.

The photoresist layers 150 and 150' having a predetermined pattern may be formed on the substrate 110 on which the oxide thin film 140 is formed. In particular, the photoresist layers 150 and 150' are formed on the substrate 110, on which the oxide thin film 140 is formed, to have a predetermined pattern such that a channel layer is formed.

The photoresist layers 150 and 150' may be any one generally used in the field of lithography, and the type thereof is not specifically limited and may be varied.

The photoresist layers 150 and 150' may be used as masks for selective etching (E) of the oxide thin film 140. In particular, a non-overlapping region not overlapping with the photoresist layers 150 and 150', i.e., the oxide thin film 140 not covered by the photoresist layers 150 and 150' and exposed, may be selectively etched (E).

The selective etching (E) may be selective wet etching. In particular, the oxide thin film 140 may be formed by selectively wet etching the non-overlapping region not overlapping with the photoresist layers 150 and 150' using an etching solution.

In accordance with an embodiment, the oxide thin-film transistor including the oxide thin film 140 may be immersed in an etching solution for selective wet etching (not shown). In this case, the oxide thin film 140 of the non-overlapping region, which does not overlap with the photoresist layers 150 and 150' of the oxide thin-film transistor immersed in an etching solution, may be selectively wet etched by the etching solution.

The etching solution is a solution including a substance having an etch selectivity to etch the oxide thin film 140, but not to etch the photoresist layers 150 and 150'. In particular, the etching solution may be an acidic etching solution. The acidic etching solution may include, for example, any substance such as acetic acid, hydrochloric acid, perchloric acid, or an organic acid, but the present invention is not limited thereto.

The selective etching (E) may be performed, for example, for 30 seconds to 10 minutes, preferably four minutes to seven minutes, but the present invention is not limited thereto. The time of the selective etching may be variously controlled depending upon the size of the oxide thin film 140, such as the thickness and width of the oxide thin film 140.

Referring to FIG. 2B, the oxide thin film 140 may be selectively etched using the photoresist layers 150 and 150'.

The selectively etched oxide thin film 140 may include the channel region 141, and the source and drain regions 143 and 143' disposed on the channel region 141 and spaced from each other by the selective etching.

In particular, the selectively etched oxide thin film 140 may have a well-shaped recessed pattern by the selective etching. The well-shaped recessed pattern may include a channel region 141 forming a lower layer, an intermediate region 142 forming an intermediate layer, and source and drain regions 143 and 143' forming upper layers.

Here, the thickness of the etched portion of the selectively etched oxide thin film 140 may be controlled according to the processing time of the selective etching.

The selectively etched oxide thin film 140 may include a concentration profile due to a dopant diffused from the gate insulating layer 130 by the selective etching. In particular, the selectively etched oxide thin film 140 may include a concentration profile having concentration gradient from the substrate 110 to an upper part by the dopant diffused from the gate insulating layer 130.

The concentration gradient may be characterized in that the concentration of the dopant increases from the substrate 110 to an upper part. For example, the concentration of the dopant of the oxide thin film 140 may be decreased in an order of the lower layer 141>the intermediate layer 142>the upper part layer 143.

The channel region 141 may function as a channel layer by the concentration profile due to the dopant. In particular, the channel region 141 may include a concentration profile wherein the concentration of the dopant diffused from the gate insulating layer 130 in the channel region 141 is high compared to the source and drain regions 143 and 143'. In addition, due to such a high dopant concentration of the channel region 141, the channel region 141 has semiconductor characteristics and thus may function as a channel layer.

In addition, the thickness of the channel layer of the selectively etched oxide thin film 140 may be adjusted by controlling the concentration profile through the selective etching. In particular, an etching degree of the oxide thin film 140 increases with increasing selective etching time, and thus, the thickness of the channel layer may be reduced. When the thickness of the channel layer is reduced, a dopant concentration in the channel layer may be further increased.

Referring to FIG. 2C, the oxide thin-film transistor 100 may be finally completed by removing the photoresist layers 150 and 150' of FIG. 2B.

The oxide thin-film transistor 100 may be a homojunction transistor wherein the channel region 141 and the source and drain regions 143 and 143' are formed of the same material.

The channel region 141 is a lower layer of the oxide thin film formed by selective etching and includes a dopant diffused from the gate insulating layer 130 in a high concentration profile, thereby having semiconductor characteristics. Accordingly, the channel region 141 may function as a channel layer.

The source and drain regions 143 and 143' are upper layers of the oxide thin film which are not selectively etched, and include a dopant concentration profile lower than the channel region 141. Accordingly, the source and drain regions 143 and 143' may function as source and drain electrodes, respectively.

In the oxide thin-film transistor 100 according to an embodiment of the present disclosure, off current is reduced and superior current characteristics are exhibited. Accordingly, the electrical characteristics of a device may be improved.

Hereinafter, an oxide thin-film transistor according to another embodiment of the present disclosure and a method of fabricating the same are described referring to FIG. 3.

Figure 3:
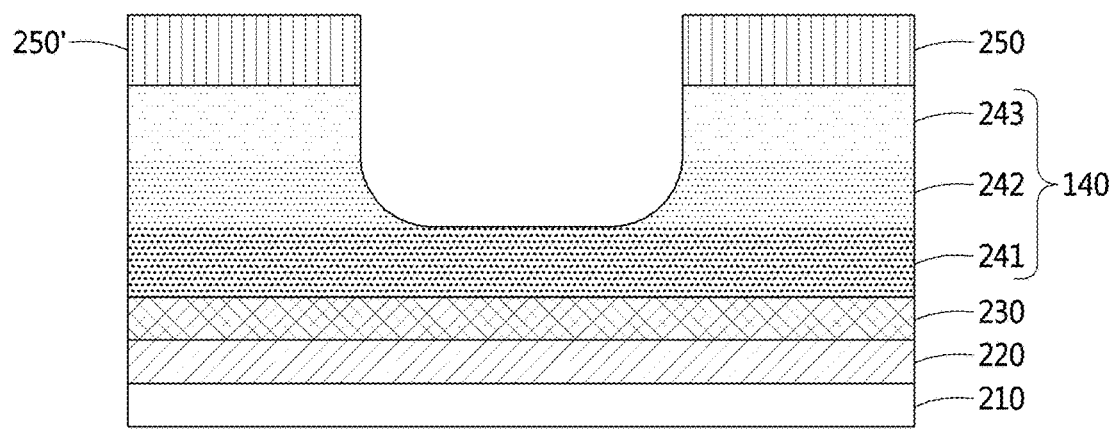
FIG. 3 illustrates a sectional view of an oxide thin-film transistor according to another embodiment of the present disclosure.

FIG. 3 illustrates a sectional view of an oxide thin-film transistor according to another embodiment of the present disclosure.

Referring to FIG. 3, an oxide thin-film transistor 200 according to another embodiment of the present disclosure includes a substrate 220, a gate electrode 220 formed on the substrate 210, a gate insulating layer 230 formed on the gate electrode 220, an oxide thin film 240 formed on the gate insulating layer 230, and source and drain electrodes 250 and 250' formed on the oxide thin film 240.

The substrate 210 is a base for forming the oxide thin-film transistor 200 and a material thereof is not specifically limited so long as the material is generally used in the art. The substrate 210 may be made of, for example, various materials such as silicon, glass, plastic, or metal foil. In the case of silicon, a substrate wherein a silicon oxide layer is formed on a surface of silicon may be used.

The gate electrode 220 is formed on the substrate 210. As the gate electrode 220, an electrically conductive material, a metal or a metal oxide, may be used. The gate electrode 220 may be made of, for example, a metal such as Al, Cr, Au, Ti, or Ag, a metal oxide such as Indium Tin Oxide (ITO), Iridium Zinc Oxide (IZO), or Iridium Tin Zinc Oxide (ITZO), or a mixture thereof.

The gate insulating layer 230 is formed on the gate electrode 220. The gate insulating layer 230 may be made of an insulating material used in a general semiconductor process. The gate insulating layer 230 may be made of, for example, a high-K material, $HfO_2$, $Al_2O_3$, $ZrO_2$, or $Si_3N_4$ or a mixture thereof, having higher permittivity than $SiO_2$ and $SiO_2$.

The oxide thin film 240 is formed on the gate insulating layer 230. In particular, the oxide thin film 240 may be formed on the substrate 210, on which the gate electrode 220 and the gate insulating layer 230 are formed, by a chemical solution deposition process. More particularly, the oxide thin film 240 may be formed by coating an oxide-containing solution on the substrate 210 on which the gate electrode 220 and the gate insulating layer 230 are formed.

The oxide thin film 240 may include a channel region 241, and source and drain regions 243 and 243' formed on the channel region 241 and spaced apart from each other. The oxide thin film 240 may include a concentration profile due to a dopant diffused from the gate insulating layer 230.

In particular, the oxide thin film 240 may include a concentration profile having a concentration gradient from the substrate 210 to an upper part due to a dopant diffused from the gate insulating layer 230.

The concentration gradient may be characterized in that the concentration of the dopant increases from the substrate 210 to an upper part. For example, the concentration of the dopant of the oxide thin film 240 may be decreased in an order of the lower layer 241>the intermediate layer 242>the upper part layer 243.

The channel region 241 may function as a channel layer by the concentration profile due to the dopant. In particular, the channel region 241 may include a concentration profile wherein the concentration of the dopant diffused from the gate insulating layer 230 in the channel region 241 is high compared to the source and drain regions 243 and 243'. In addition, due to such a high dopant concentration of the channel region 241, the channel region 241 has semiconductor characteristics and thus may function as a channel layer.

In accordance with an embodiment, the gate insulating layer 230 is formed of silicon dioxide ($SiO_2$). Here, the dopant may be silicon (Si).

The channel region 241 may be formed by selective etching. In particular, the channel region 241 may be formed by selective etching to be distinguished from the source and drain regions 243 and 243' and include the concentration profile such that the channel region 241 functions as the channel layer. The selective etching is described referring to FIGS. 2A to 2C below.

The oxide thin film 240 may have a well-shaped recessed pattern by the selective etching. In particular, the oxide thin film 240 has a well-shaped recessed pattern, the channel region 241 forms a lower layer thereof, and the source and drain regions 243 and 243' form an upper layer thereof. In addition, the intermediate region 242 may be disposed between the channel region 241 and the source and drain regions 243 and 243' and may form an intermediate layer.

The thickness of the channel layer of the oxide thin film 240 may be controlled through control of the concentration profile by the selective etching. In particular, an etching degree of the oxide thin film 240 increases as the time of the selective etching increases, whereby the thickness of the channel layer may be reduced. When the thickness of the channel layer is reduced, the dopant concentration in the channel layer may be further increased. Accordingly, the electrical conductivity of the oxide thin film may be decreased.

The oxide thin film 240 may include multi stacks formed of at least one oxide layer. In particular, the oxide thin film 240 may include multi stacks formed of a predetermined number of oxide layers so as to secure a sufficient thickness. When the oxide thin film 240 includes multi stacks, pores and pinholes are deceased and thus a high film density is provided. Accordingly, electrical conductivity sufficient for use as an oxide thin-film transistor may be provided.

The oxide thin film 240 may be made of any one selected from the group consisting of InO, ZnO, SnO, InZnO, InGaO, ZnSnO, InSnZnO and InGaZnO, but the present invention is not limited thereto.

The source and drain electrodes 250 and 250' are formed on the substrate 210 on which the oxide thin film 240 is formed. In particular, the source and drain electrodes 250 and 250' are formed on the oxide thin film 240 and spaced apart from each other.

The source and drain electrodes 250 and 250' may be made of a conductive material, a metal or metal oxide. In particular, the source and drain electrodes 250 and 250' may be made of, for example, a metal, such as Al, Cr, Au, Ti, or Ag, or a metal oxide, such as Indium Tin Oxide (ITO)), Iridium Zinc Oxide (IZO), or Indium Tin Zinc Oxide (ITZO), or a mixture thereof, as in the gate electrode 220.

In the case of the oxide thin-film transistor 200 according to an embodiment of the present disclosure, off current is decreased and thus the characteristics of high current are exhibited. Accordingly, the electrical characteristics of a device may be improved.

In addition, when the source and drain electrodes 250 and 250' of the oxide thin-film transistor according to another embodiment of the present disclosure 200 are made of a metal, electrical conductivity is high, compared to the source and drain regions 143 and 143' made of an oxide of the oxide thin-film transistor 100. Accordingly, the electrical characteristics of a device may be further improved.

Hereinafter, a method of fabricating the oxide thin-film transistor according to another embodiment of the present disclosure is described referring to FIGS. 4A and 4B.

Figure 4A:
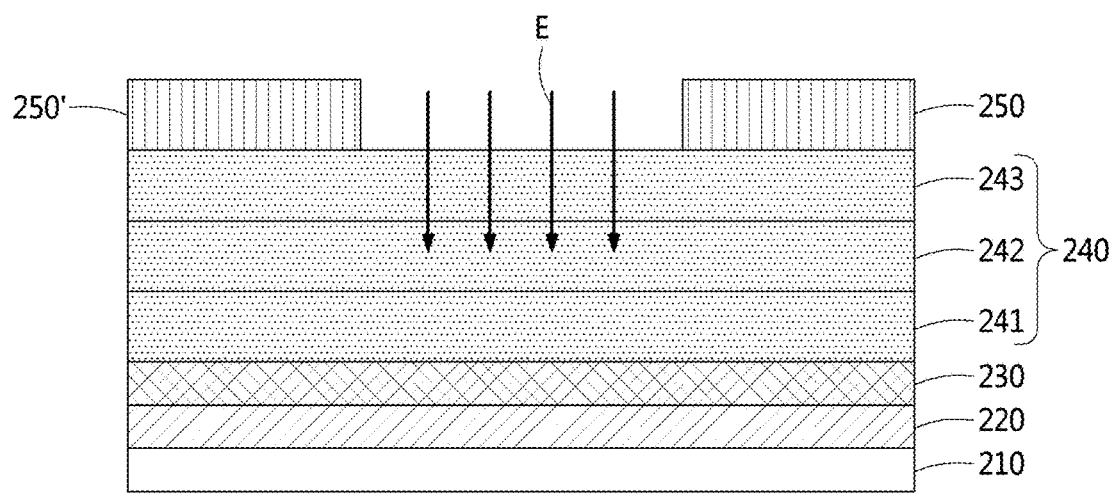
FIGS. 4A and 4B illustrate schematic diagrams of a selective etching process of an oxide thin-film transistor according to another embodiment of the present disclosure.
Figure 4B:
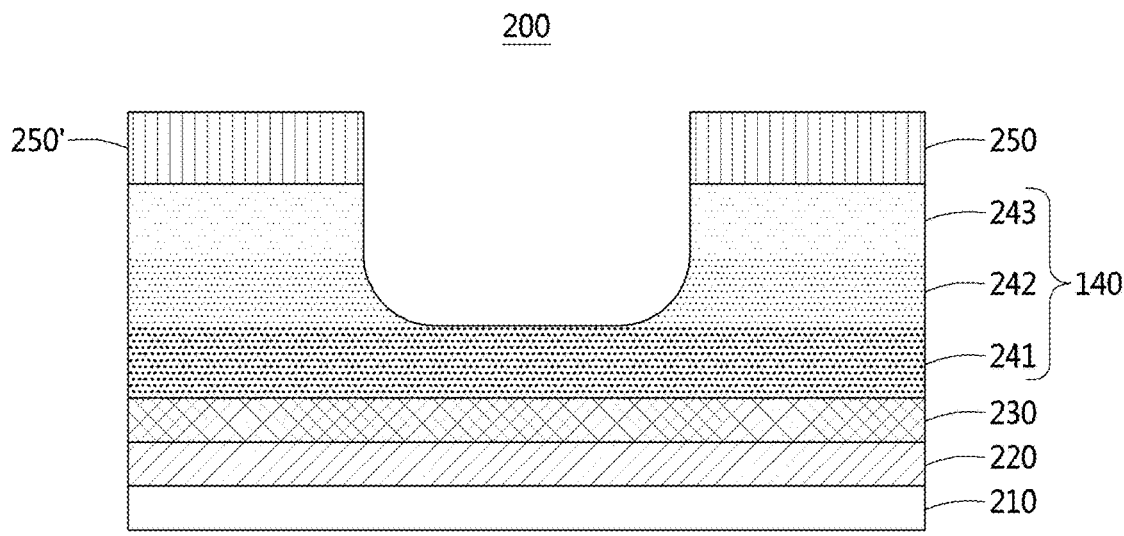

FIGS. 4A and 4B illustrate schematic diagrams of the selective etching process of the oxide thin-film transistor according to another embodiment of the present disclosure.

Referring to FIG. 4A, the oxide thin film 240 may be formed on the substrate 210 by a chemical solution deposition process. In particular, the oxide thin film 240 may be formed by coating an oxide-containing solution on the substrate 210 on which the gate electrode 220 and the gate insulating layer 230 are formed.

The oxide-containing solution may be, for example, a solution containing an oxide precursor for forming an oxide thin film, such as InO, ZnO, SnO, InZnO, InGaO, ZnSnO, InSnZnO, or InGaZNo. The oxide precursor may include, for example, $In(NO_3)_3H_2O$, $Ga(NO_3)_3H_2O$, $Zn(CH_3COO)_2 \cdot H_2O$, or the like, but the present invention is not limited thereto. For example, the oxide-containing solution may include indium (In) and zinc (Zn) in a mole ratio of 9:3.

A method of coating the oxide-containing solution is not specifically limited so long as the method is used in the art. For example, the method may be spin coating, spray coating, inkjet coating, slit coating, dip coating, or the like. Preferably, a spin coating method is used.

A spin coating method, which is a method most generally used in the art, is characterized by dropping a predetermined amount of solution on a substrate and then rotating the substrate at a high speed such that the substrate is coated by centrifugal force applied to the solution.

The oxide thin film 240 may be formed by spin coating an oxide-containing solution on the substrate 210 on which the gate electrode 220 and the gate insulating layer 230 are formed.

According to another embodiment of the present disclosure, since the oxide thin film 240 is formed by a chemical solution deposition process such as spin coating, production costs may be reduced compared to a deposition process.

The oxide thin film 240 may include multi stacks composed of at least one oxide layer. In particular, the oxide thin film 240 may be formed of multi stacks composed of a plurality of oxide layers by repeating an oxide thin film formation process. When the oxide thin film 240 is formed of the plurality of oxide layers, the thickness of the oxide thin film 240 may increase with increasing oxide layer number.

The oxide thin film 240 may be a three-layered oxide thin film composed of first, second, and third oxide layers 241, 242, and 243 formed by repeating an oxide thin film formation process, as illustrated in FIG. 4A.

One oxide layer may have, for example, a thickness of 1 nm to 50 nm, preferably a thickness of 1 nm to 10 nm, more preferably a thickness of 1 nm to 5 nm.

When the oxide thin film is formed in three layers, a total thickness of the three-layered oxide thin film may be, for example, 3 nm to 150 nm, preferably 3 nm to 30 nm, more preferably 3 nm to 15 nm. In addition, the thicknesses of the respective layers may be different.

The oxide thin film 240 may be formed on the substrate 210 on which the gate electrode 220 and the gate insulating layer 230 are formed by coating with an oxide-containing solution, followed by annealing. When the oxide thin film 240 is annealed, the concentration of oxygen vacancies in the oxide thin film increases and thus the concentration of electrons increases, whereby electrical conductivity of the oxide thin film may be increased.

The annealing may be performed, for example, at 300° C. to 500° C. for 30 minutes to 3 hours.

The source and drain electrodes 250 and 250' are formed on the substrate 210 on which the oxide thin film 240 is formed.

The source and drain electrodes 250 and 250' having a predetermined pattern may be formed on the substrate 210 on which the oxide thin film 240 is formed. In particular, the source and drain electrodes 250 and 250' is formed on the substrate 210, on which the oxide thin film 240 is formed, to have a predetermined pattern such that a channel layer is formed.

The source and drain electrodes 250 and 250' may be any one generally used in the field of lithography, and the type thereof is not specifically limited and may be varied.

The source and drain electrodes 250 and 250' may be used as masks for selective etching (E) of the oxide thin film 240. In particular, a non-overlapping region not overlapping with the source and drain electrodes 250 and 250', i.e., the oxide thin film 240 not covered by the source and drain electrodes 250 and 250' and exposed, may be selectively etched (E).

The selective etching (E) may be selective wet etching. In particular, the oxide thin film 240 may be formed by selectively wet etching the non-overlapping region not overlapping with the source and drain electrodes 250 and 250' using an etching solution.

In accordance with an embodiment, the oxide thin-film transistor including the oxide thin film 240 may be immersed in an etching solution for selective wet etching (not shown). In this case, the oxide thin film 240 of the non-overlapping region, which does not overlap with the source and drain electrodes 250 and 250' of the oxide thin-film transistor immersed in an etching solution, may be selectively wet etched by the etching solution.

The etching solution is a solution including a substance having an etch selectivity to etch the oxide thin film 240, but not to etch the source and drain electrodes 250 and 250'. In particular, the etching solution may be an acidic etching solution. The acidic etching solution may include, for example, any substance such as acetic acid, hydrochloric acid, perchloric acid, or an organic acid, but the present invention is not limited thereto.

The selective etching (E) may be performed, for example, for 30 seconds to 10 minutes, preferably four minutes to seven minutes, but the present invention is not limited thereto. The time of the selective etching may be variously controlled depending upon the size of the oxide thin film 240, such as the thickness and width of the oxide thin film 240.

Referring to FIG. 4B, the oxide thin film 240 may be selectively etched using the source and drain electrodes 250 and 250'.

The selectively etched oxide thin film 240 may include the channel region 241 by the selective etching.

In particular, the selectively etched oxide thin film 240 may have a well-shaped recessed pattern by the selective etching. The well-shaped recessed pattern may include a channel region 241 forming a lower layer, an intermediate region 242, and an upper layer 243.

Here, the thickness of the etched portion of the selectively etched oxide thin film 240 may be controlled according to the processing time of the selective etching.

The selectively etched oxide thin film 240 may include a concentration profile due to a dopant diffused from the gate insulating layer 230 by the selective etching. In particular, the selectively etched oxide thin film 240 may include a concentration profile having concentration gradient from the substrate 210 to an upper part by the dopant diffused from the gate insulating layer 230.

The concentration gradient may be characterized in that the concentration of the dopant increases from the substrate 210 to an upper part. For example, the concentration of the dopant of the oxide thin film 240 may be decreased in an order of the lower layer 241>the intermediate layer 242>the upper part layer 243.

The channel region 241 may function as a channel layer by the concentration profile due to the dopant. In particular, the channel region 241 may include a concentration profile wherein the concentration of the dopant diffused from the gate insulating layer 230 in the channel region 241 is high compared to the intermediate layer 242 and the upper part layer 243. In addition, due to such a high dopant concentration of the channel region 241, the channel region 241 has semiconductor characteristics and thus may function as a channel layer.

In addition, the thickness of the channel layer of the selectively etched oxide thin film 240 may be adjusted by controlling the concentration profile through the selective etching. In particular, an etching degree of the oxide thin film 240 increases with increasing selective etching time, and thus, the thickness of the channel layer may be reduced. When the thickness of the channel layer is reduced, a dopant concentration in the channel layer may be further increased.

In the case of the oxide thin-film transistor 200 according to an embodiment of the present disclosure, off current is decreased and thus the characteristics of high current are exhibited. Accordingly, the electrical characteristics of a device may be improved.

In addition, when the source and drain electrodes 250 and 250' of the oxide thin-film transistor according to another embodiment of the present disclosure 200 are made of a metal, electrical conductivity is high, compared to the source and drain regions 143 and 143' made of an oxide of the oxide thin-film transistor 100. Accordingly, the electrical characteristics of a device may be further improved.

Now, the present invention will be described in more detail with reference to the following preferred examples. These examples are provided for illustrative purposes only and should not be construed as limiting the scope and spirit of the present invention.

Example 1: Oxide Thin-Film Transistor Including Source and Drain Electrodes

<Substrate Preparation>

A p+ Si substrate on which $SiO_2$ was formed (hereinafter, referred to as $SiO_2$/p+ Si substrate) was prepared for coating with an InZnO solution. Here, the $SiO_2$/p+ Si substrate was subjected to ultrasonic cleaning using acetone and methanol sequentially for 10 minutes each, and then subjected to blurring using a nitrogen gun.

<InZnO Solution Preparation>

First, an InZnO precursor was prepared by mixing indium nitrate hydrate ($In(NO_3)_3 \cdot xH_2O$) and zinc nitrate hydrate ($Zn(NO_3)_2 \cdot xH_2O$) in a molar ratio of 9:3, and then an InZnO solution was prepared by dissolving the InZnO precursor in a solvent of 2-methoxyethanol (2ME) at a concentration of 0.1 M. The InZnO solution has a ratio of In:Zn of 9:3 to maintain high electrical conductivity of an InZnO thin film.

<InZnO Thin Film Formation>

An InZnO solution was deposited on a $SiO_2$/p+ Si substrate using spin coating to form an InZnO thin film. Three layers of InZnO thin film were sequentially formed using spin coating to ensure adequate electrical conductivity of the thin film.

Spin coating was carried out at a rate of 3,000 rpm for 30 seconds to form the first layer of an InZnO thin film. A substrate coated with an InZnO solution was subjected to pre-annealing treatment at 100° C. for 5 minutes, and then was subjected to annealing treatment at 380° C. for 30 minutes.

Spin coating was carried out at a rate of 3,000 rpm for 30 seconds to form the second layer of an InZnO thin film. A substrate coated with an InZnO solution was subjected to pre-annealing treatment at 100° C. for 5 minutes, and then subjected to annealing treatment at 380° C. for 30 minutes.

Spin coating was carried out at a rate of 3,000 rpm for 30 seconds to form the third layer of an InZnO thin film. A substrate coated with an InZnO solution was subjected to pre-annealing treatment at 100° C. for 5 minutes, and then finally subjected to annealing treatment at 380° C. for 1 hour and 30 minutes.

Through these procedures, a three-layered InZnO thin film was formed on a $SiO_2$/p+ Si substrate, and the electrical conductivity of a thin film could be improved by forming the thin film in multiple layers.

<Formation of Source and Drain Electrodes>

After formation of a three-layered InZnO thin film, aluminum source and drain electrodes were deposited using an RF sputtering device. In this case, the source and drain electrodes were deposited so that the width (W) and length (L) of a channel layer were 300 μm and 15 μm, respectively.

<Formation of Channel Layer>

To form a channel layer by selective wet etching of an InZnO thin film, the fabricated element was dipped in a 5% dilute acetic acid solution. Etching (or dipping) time was adjusted based on Table 1. The thicknesses of three-layered InZnO thin films depending on etching (or dipping) time are shown in Table 1 below.

TABLE 1

| Etching time (minutes) | Thickness of InZnO thin film (nm) |
|---|---|
| 0 (pristine) | 17.2 |
| 1 | 12.4 |
| 2 | 9.8 |
| 3 | 8.8 |

Hereinafter, electrical characteristics according to the number of layers of the oxide thin film in accordance with an aspect of the present disclosure are described referring to FIG. 5.

Figure 5:
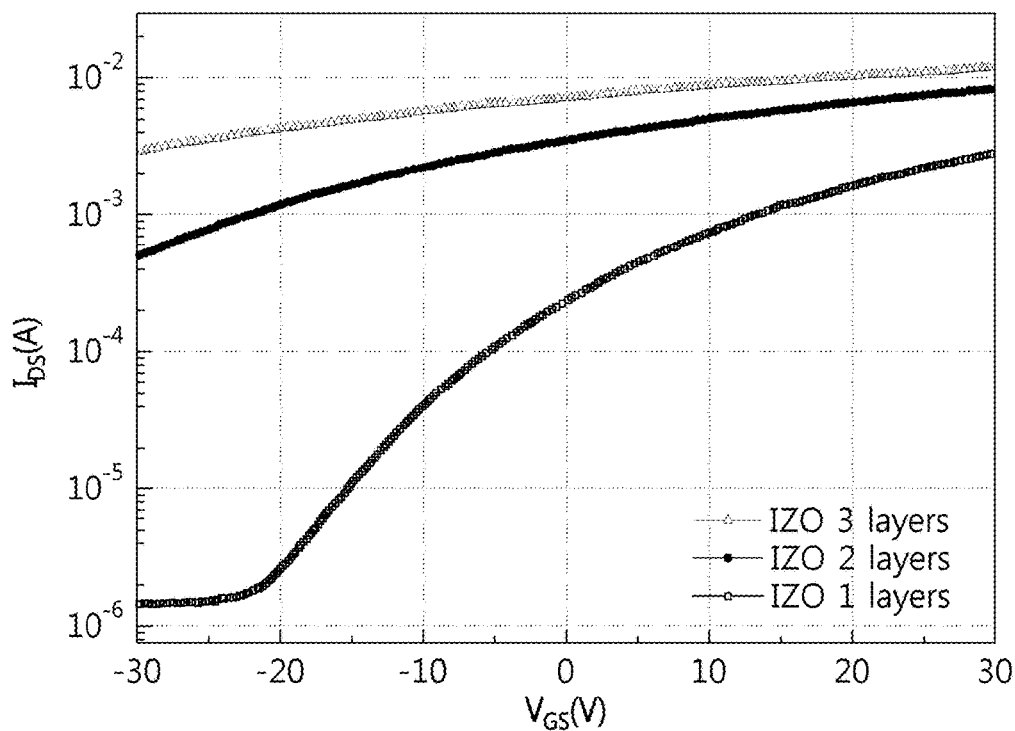
FIG. 5 is a graph illustrating electrical characteristics of an oxide thin-film transistor according to the number of InZnO thin film layers in accordance with an aspect of the present disclosure.

FIG. 5 is a graph illustrating the electrical characteristics of the oxide thin-film transistor according to the number of InZnO thin film layers in accordance with an aspect of the present disclosure. In particular, FIG. 5 illustrates electrical characteristics of the oxide thin-film transistor having an one-, two-, or three-layered InZnO(IZO) thin film according to Example 1.

Referring to FIG. 5, it can be confirmed that electrical conductivity increases as the number of InZnO thin film layers increases from one to three, i.e., the thickness of an InZnO thin film increases. From this result, it can be confirmed that, when the InZnO thin film is formed a multi-layers, pores and pinholes of the InZnO thin film are decreased and thus high film density is provided, thereby exhibiting electrical conductivity sufficient for use as a thin film transistor.

Hereinafter, oxide thin film thickness change according to etching time of the oxide thin film in accordance with an aspect of the present disclosure is described referring to FIG. 6.

Figure 6:
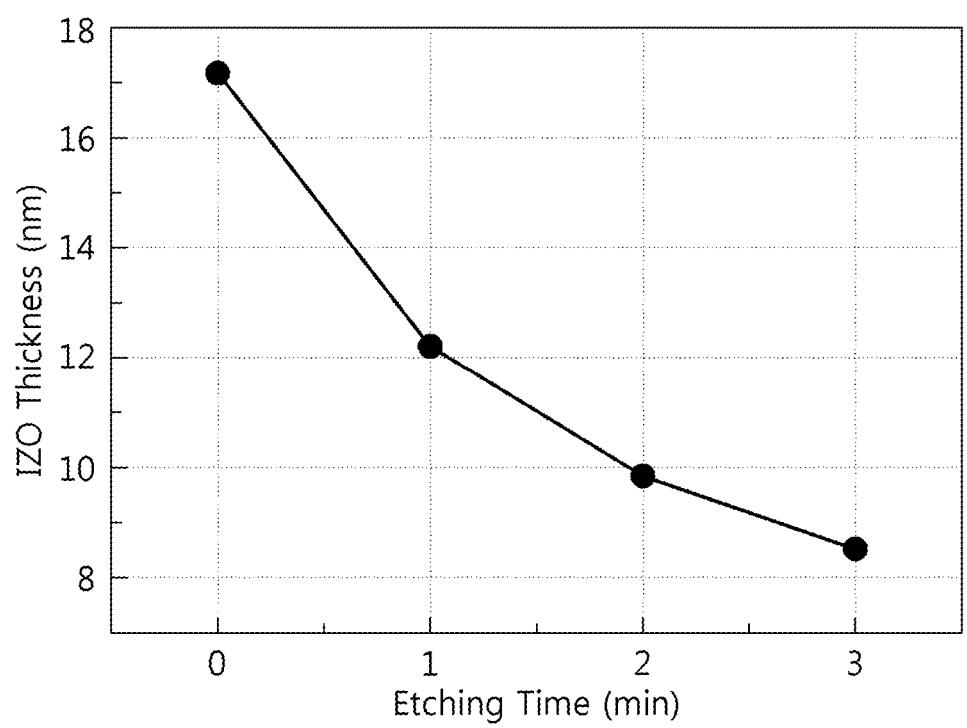
FIG. 6 is a graph illustrating an InZnO thin film thickness according to selective etching time in accordance with an aspect of the present disclosure.

FIG. 6 is a graph illustrating an InZnO thin film thickness according to selective etching time in accordance with an aspect of the present disclosure. In particular, FIG. 6 illustrates the thicknesses of the thin film measured by ellipsometry after wet etching an InZnO thin film, which was formed on a non-patterned substrate, with 5% acetic acid by a chemical solution deposition process according to Example 1.

Referring to FIG. 6, it can be confirmed that an etching degree of InZnO thin film increases with increasing etching time from 0 minutes to three minutes and thus the thickness of the InZnO thin film is decreased. From this result, it can be confirmed that the thickness of the InZnO thin film may be controlled by adjusting the time for immersing the InZnO thin film in an etching solution, i.e., the etching time for the InZnO thin film.

Hereinafter, the electrical characteristics of the oxide thin-film transistor according to selective etching time for the oxide thin film in accordance with an aspect of the present disclosure are described referring to FIG. 7.

Figure 7:
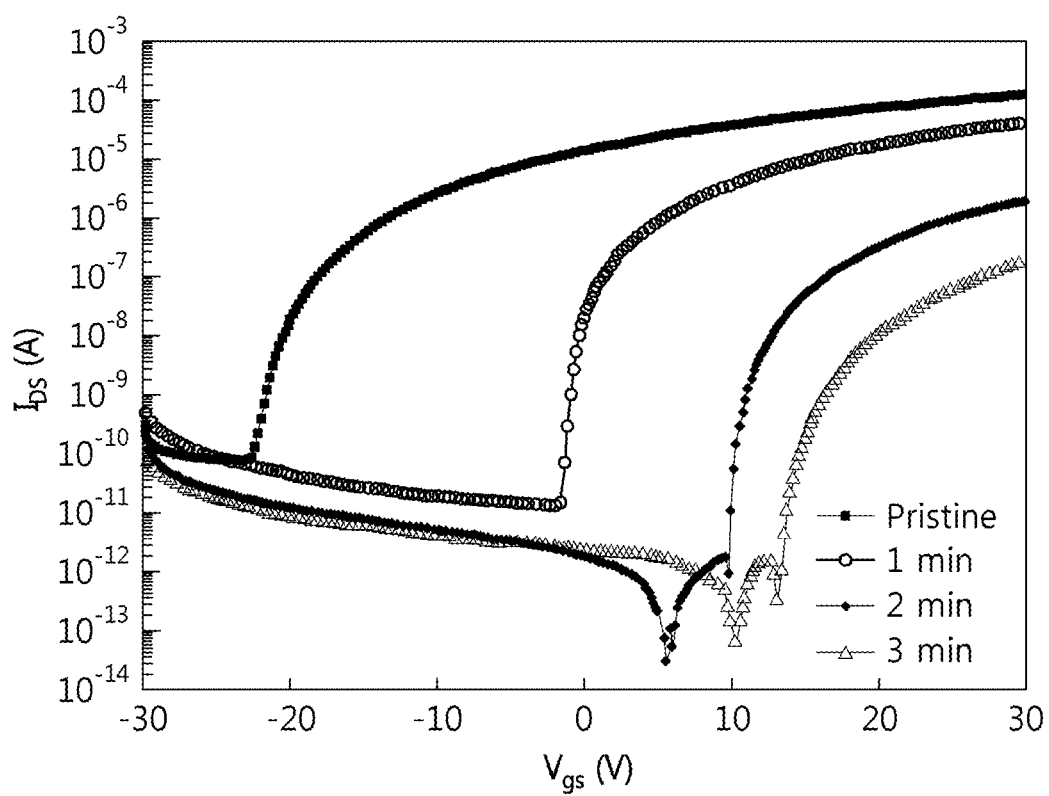
FIG. 7 is graph illustrating electrical characteristics according to selective etching time of an InZnO thin film an oxide thin-film transistor in accordance with an aspect of the present disclosure.

FIG. 7 is graph illustrating electrical characteristics according to selective etching time of an InZnO thin film an oxide thin-film transistor in accordance with an aspect of the present disclosure. In particular, FIG. 7 illustrates the electrical characteristics of the oxide thin-film transistor according to selective etching time of an InZnO thin film annealed at 380° C. according to Example 1.

FIG. 7 illustrates the transfer characteristics of the oxide thin-film transistor device according to the etching time for the InZnO thin film in the InZnO thin film transistor annealed at 380° C. after formation of the InZnO thin film coated with an InZnO solution.

It can be confirmed that, when the InZnO thin film is not etched (pristine), the electrical conductivity of the InZnO thin film transistor is not so high and thus transfer characteristics are not exhibited. This occurs because the electrical conductivity of the InZnO thin film which was not etched from the beginning is not so high.

Meanwhile, it can be confirmed that, when the InZnO thin film is etched for one minute and thus turn-on voltage approaches 0 V, on current and mobility, as electrical characteristics, are low. In addition, it can be confirmed that, in the cases of two minutes and three minutes, transfer characteristics are exhibited, but a difference between on current and off current is not $10^3$ or more. Accordingly, it can be confirmed that it is difficult to use the InZnO thin film transistor as a thin film transistor.

Hereinafter, the electrical characteristics of an oxide thin-film transistor according to selective etching time for the oxide thin film in accordance with an aspect of the present disclosure are additionally described referring to FIG. 8.

Figure 8:
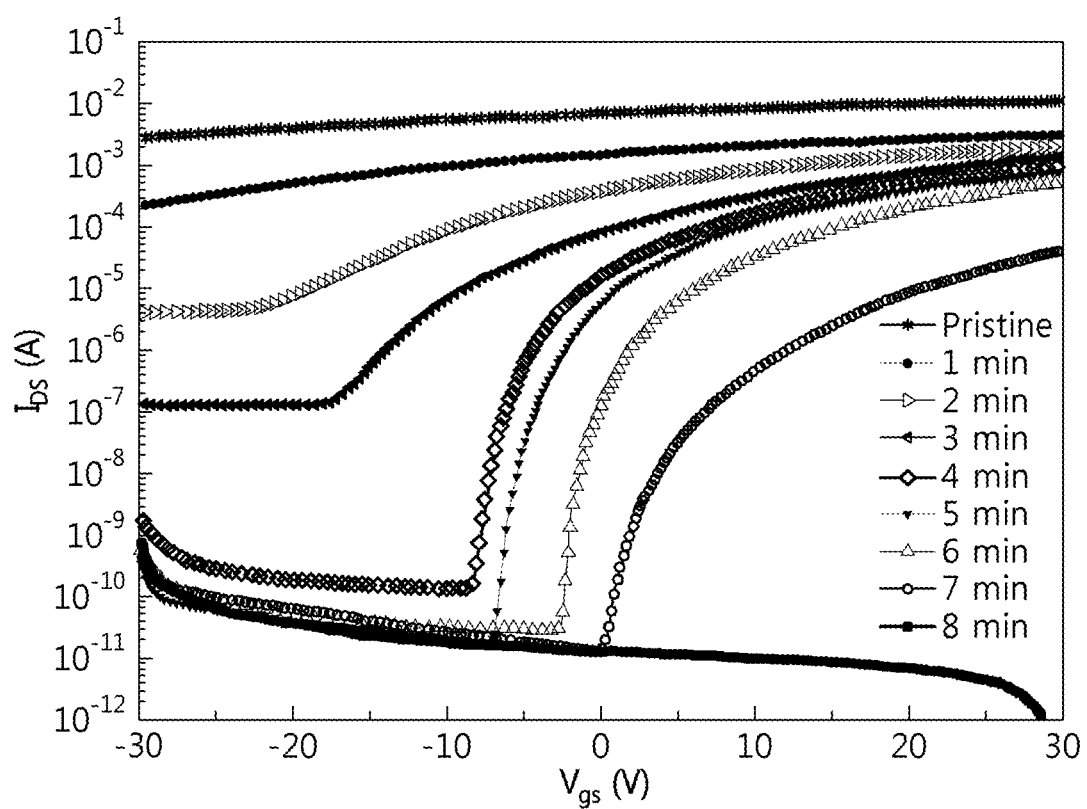
FIG. 8 is a graph illustrating electrical characteristics of an oxide thin-film transistor according to selective etching time of a three-layered InZnO thin film in accordance with an aspect of the present disclosure.

FIG. 8 is a graph illustrating electrical characteristics of an oxide thin-film transistor according to selective etching time of a three-layered InZnO thin film in accordance with an aspect of the present disclosure.

In particular, FIG. 8 illustrates the electrical characteristics of an oxide thin-film transistor according to selective etching time while adjusting selective etching time for the InZnO thin film from one minute to eight minutes after forming Al source/drain electrodes on the three-layered InZnO thin film according to Example 1.

Referring to FIG. 8, it can be confirmed that the electrical conductivity of the InZnO thin film is controlled according to increase of selective etching time for the InZnO thin film and thus semiconductor characteristics are exhibited. In particular, when the selective etching time of the InZnO thin film is adjusted from five minutes to six minutes, the electrical characteristics of the oxide thin-film transistor are best. In addition, it can be confirmed that, when the selective etching time for the InZnO thin film is too long, the InZnO thin film is completely removed and thus insulative characteristics are exhibited.

In addition, the electrical characteristics of an oxide thin-film transistor dependent upon selective etching time of the three-layered InZnO thin film according to Example 1 are summarized in Table 2 below.

TABLE 2

| Etching time (minutes) | μFET (cm$^2$/Vs) | Vth (V) | On/Off current ratio | S.S (V/dec) |
|---|---|---|---|---|
| 0 (pristine) ~ 2 | | | Conductive | |
| 3 | 11.24 | −6.72 | 1.09 × 10$^4$ | 3.78 |
| 4 | 11.59 | −2.42 | 8.18 × 10$^6$ | 0.75 |
| 5 | 10.14 | −1.00 | 4.91 × 10$^7$ | 0.64 |
| 6 | 8.20 | 4.34 | 1.18 × 10$^7$ | 0.63 |
| 7 | 1.77 | 14.08 | 3.41 × 10$^6$ | 1.00 |
| 8 | | | Insulating | |

Referring to Table 2, it can be confirmed that, when the selective etching time for the InZnO thin film is adjusted to five minutes, mobility (μFET) is satisfactorily 10 or more and on/off current ratio is satisfactorily 10$^7$. In addition, it can be confirmed that, when etching is further performed, the characteristics of the device are gradually deteriorated, and, at an etching time of eight minutes, the InZnO thin film is completely etched and thus transfer characteristics are not further exhibited.

Hereinafter, oxide thin film thickness change according to the number of layers of the oxide thin film in accordance with an aspect of the present disclosure is described referring to FIG. 9.

Figure 9:
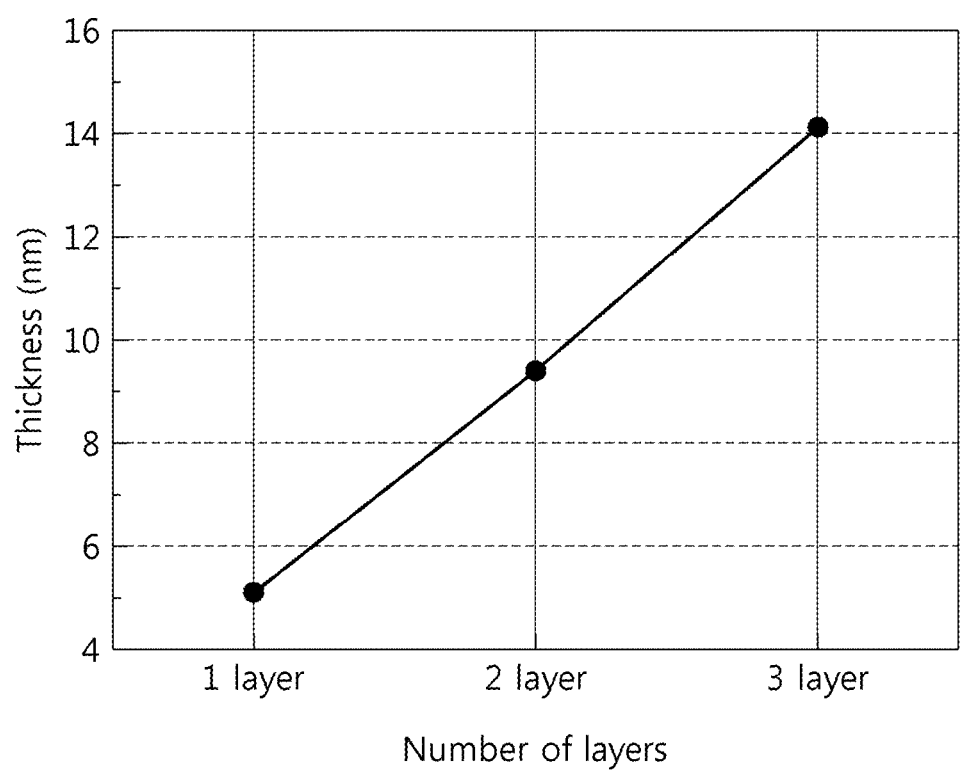
FIG. 9 is a graph illustrating the thickness of an InZnO thin film according to the number of InZnO thin film layers in accordance with an aspect of the present disclosure.

FIG. 9 is a graph illustrating the thickness of an InZnO thin film according to the number of InZnO thin film layers in accordance with an aspect of the present disclosure. In particular, FIG. 9 is graph illustrating a change in the thickness of the three-layered InZnO thin film according to Example 1.

Referring to FIG. 9, it can be confirmed that the thickness of the InZnO thin film increases from 5 nm to 9.4 nm and 14 nm as the number of InZnO thin film layers increases from one layer to two and three layers.

Hereinafter, oxide thin film thickness change according to the etching time for the oxide thin film in accordance with an aspect of the present disclosure is described referring to FIG. 10.

Figure 10:
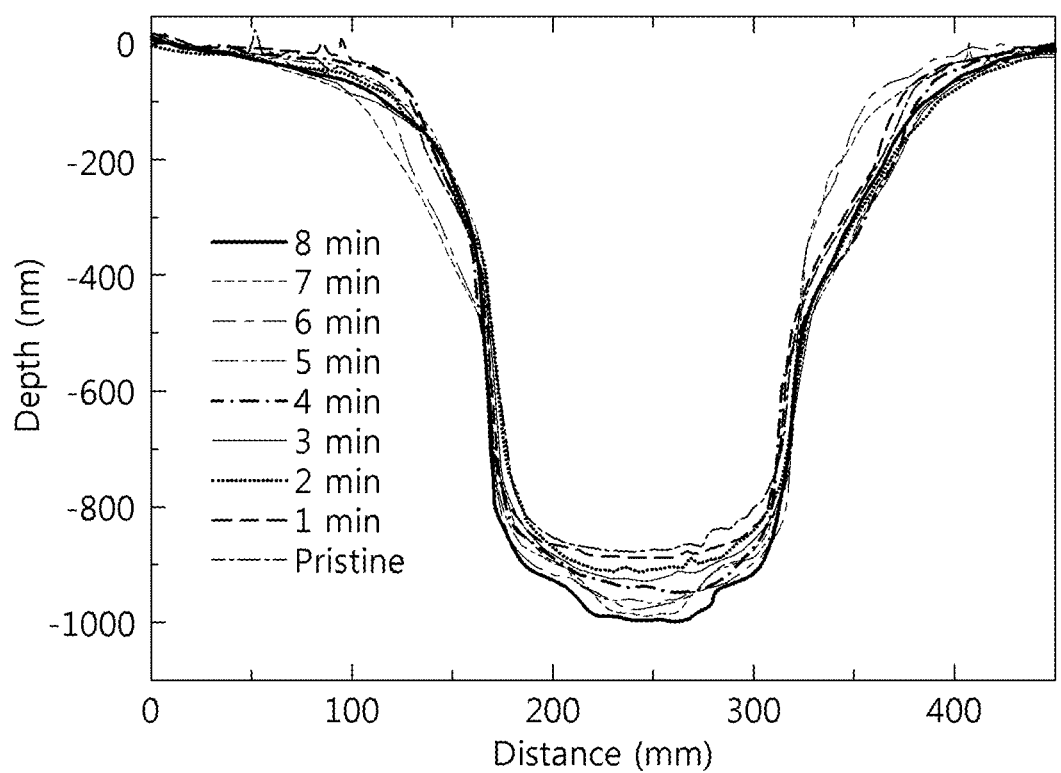
FIG. 10 is a graph illustrating a change in the thickness of an InZnO thin film according to selective etching time of a three-layered InZnO thin film in accordance with an aspect of the present disclosure.

FIG. 10 is a graph illustrating a change in the thickness of an InZnO thin film according to selective etching time of a three-layered InZnO thin film in accordance with an aspect of the present disclosure.

In particular, FIG. 10 illustrates InZnO thin film thickness change according to selective etching time by adjusting the selective etching time for the InZnO thin film from one minute to eight minutes after forming Al source/drain electrodes on the three-layered InZnO thin film according to Example 1.

In FIG. 10, an x axis represents a distance (mm) to the Al source electrode, the channel layer, and the Al drain electrode, and a y axis represents a depth (nm) with respect to the Al source/drain electrodes. In particular, the depth represents a step (height difference) between the Al source/drain electrodes and the selectively etched InZnO thin film. This depth was measured by means of an Alpha-Step instrument.

In particular, Referring to FIG. 10, it can be confirmed that the step between the Al source/drain electrodes and the selectively etched InZnO thin film increases as the selective etching time for the InZnO thin film increases.

Hereinafter, Transmission Electron Microscopic (TEM) image characteristics for the oxide thin-film transistor in accordance with an aspect of the present disclosure are described referring to FIG. 11.

Figure 11:
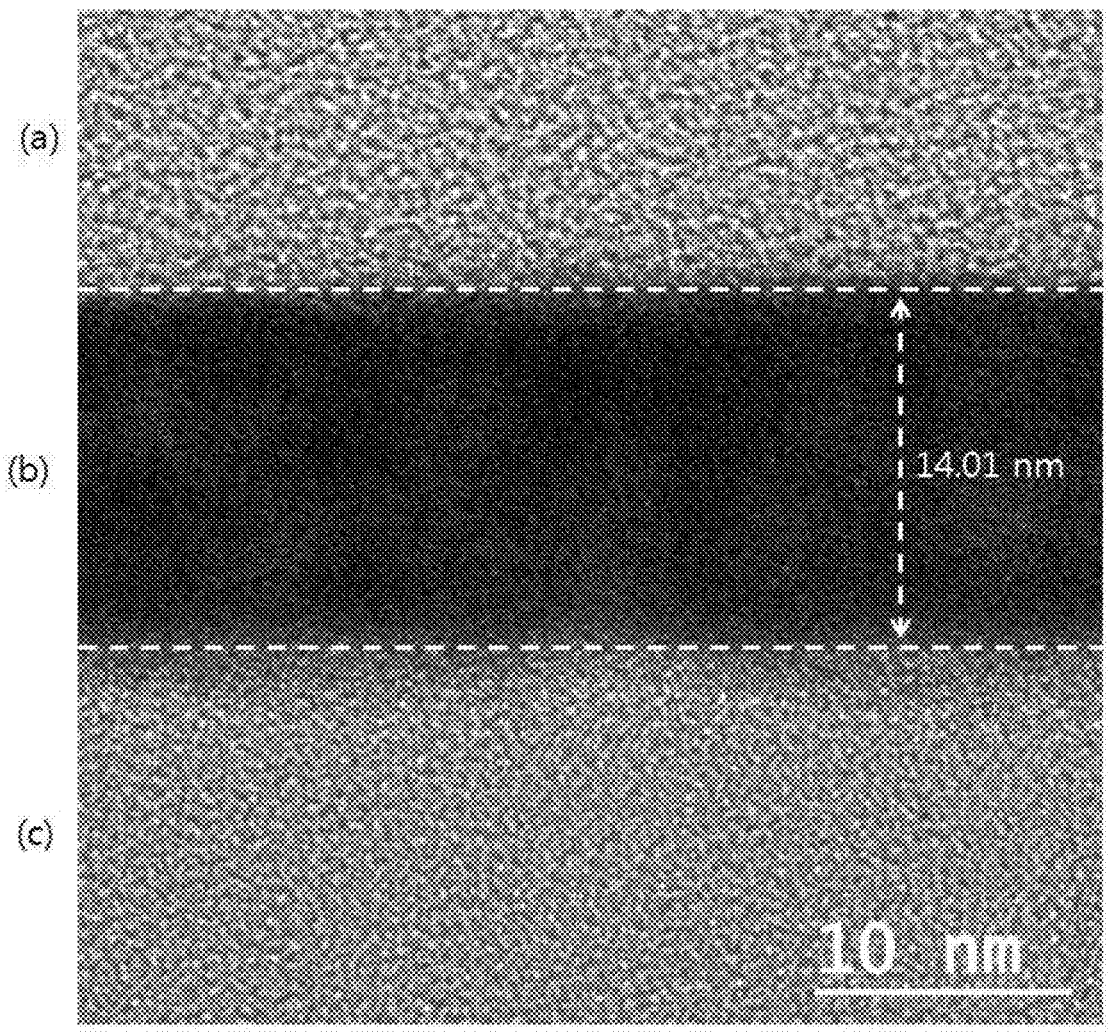
FIG. 11 illustrates a transmission electron microscopic (TEM) image of an oxide thin-film transistor in accordance with an aspect of the present disclosure.

FIG. 11 illustrates a transmission electron microscopic (TEM) image of an oxide thin-film transistor in accordance with an aspect of the present disclosure. In particular, FIG. 11 illustrates a Transmission Electron Microscopic (TEM) image of an oxide thin-film transistor including the three-layered InZnO thin film according to Example 1.

In FIG. 11, (a) represents epoxy for Transmission electron microscopic analysis, (b) represents a three-layered InZnO thin film, and (c) represents a gate insulating layer, silicon dioxide ($SiO_2$).

Referring to FIG. 11, it can be confirmed that the thickness of the three-layered InZnO thin film according to Example 1 is about 14.01 nm.

Hereinafter, the energy dispersive spectroscopy (EDS) characteristics of the oxide thin-film transistor in accordance with an aspect of the present disclosure are described, referring to FIG. 12.

Figure 12:
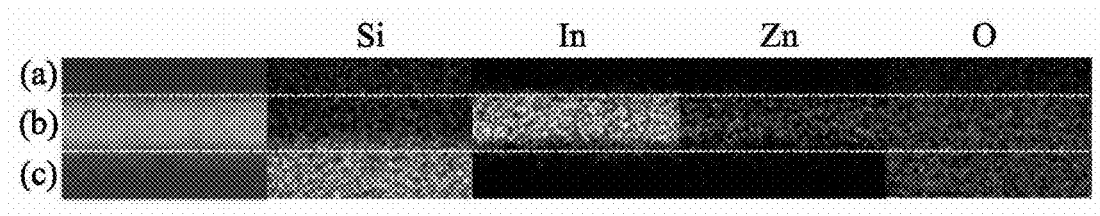
FIG. 12 illustrates an energy dispersive spectroscopy (EDS) analysis result of an oxide thin-film transistor in accordance with an aspect of the present disclosure.

FIG. 12 illustrates an energy dispersive spectroscopy (EDS) analysis result of an oxide thin-film transistor in accordance with an aspect of the present disclosure. In particular, FIG. 12 illustrates energy dispersive spectroscopy analysis images of an oxide thin-film transistor including the three-layered InZnO thin film according to Example 1.

In FIG. 12, (a) represents epoxy for energy dispersive spectroscopy analysis, (b) represents a three-layered InZnO thin film (IZO), and (c) represents a gate insulating layer, silicon dioxide ($SiO_2$).

Referring to FIG. 12, it can be confirmed that an Si dopant is diffused from a gate insulating layer made of $SiO_2$ to the an InZnO thin film.

Hereinafter, an analysis result for atoms present in the oxide thin film of the oxide thin-film transistor in accordance with an aspect of the present disclosure are provided, referring to FIGS. 13 to 16.

Figure 13:
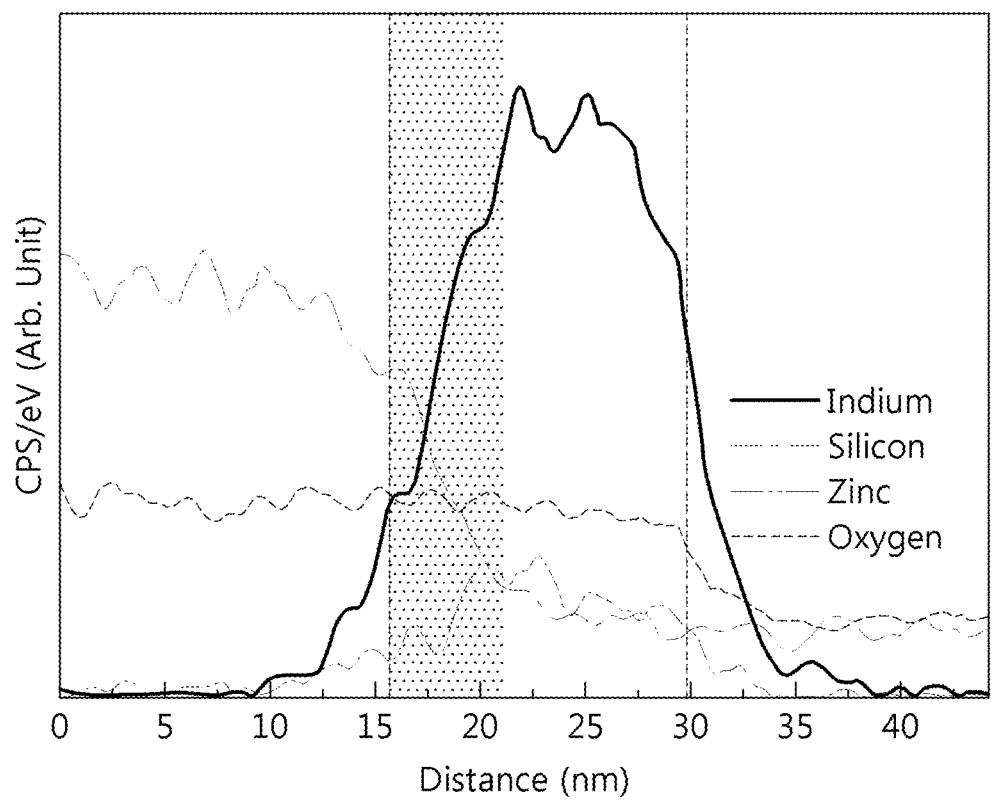
FIG. 13 is an EDS line scan profile illustrating the distribution of In, Zn, O, and Si in a thin film.

FIG. 13 illustrates an energy dispersive spectroscopy (EDS) line scan profile showing the distribution of In, Zn, O and Si in the InZnO thin film of the oxide thin-film transistor in accordance with an aspect of the present disclosure.

Referring to FIG. 13, it can be investigated that, from the observed energy dispersive spectroscopy line scan profile, where In, Zn, O and Si atoms are located in the InZnO thin film of the oxide thin-film transistor fabricated according to Example.

Figure 14:
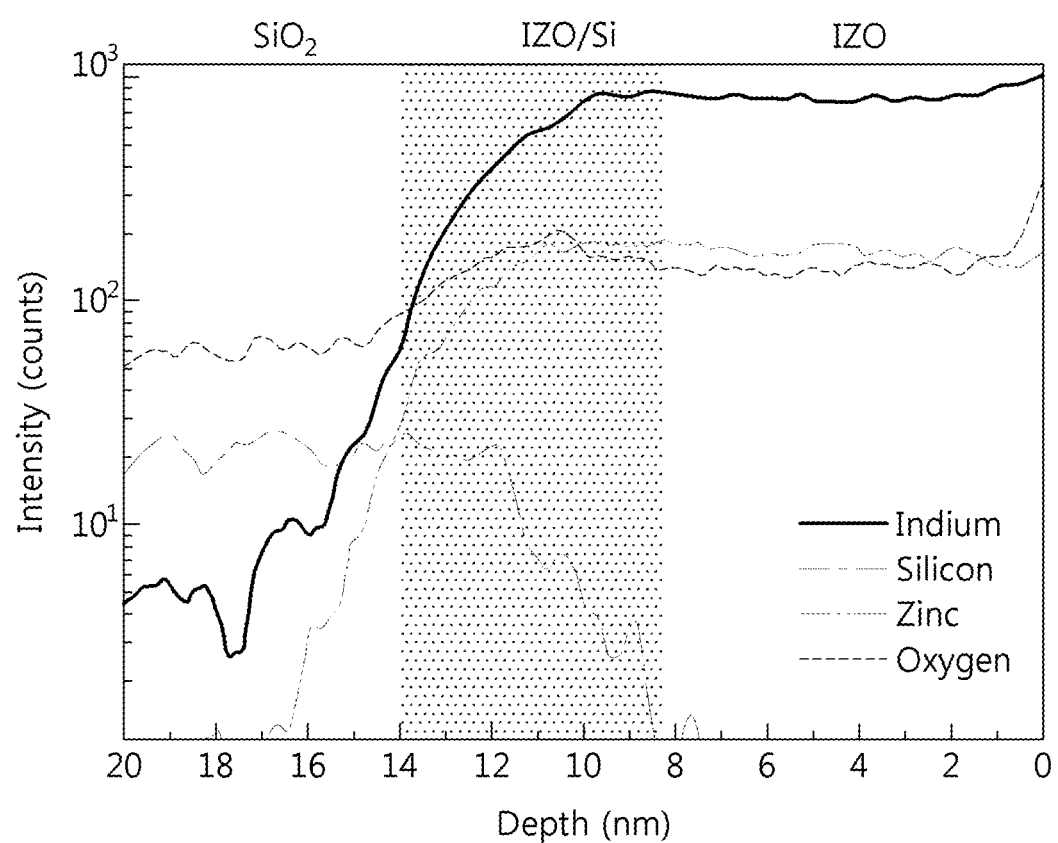
FIG. 14 illustrates a time-of-flight secondary ion mass spectroscopy (TOF-SIMS) analysis result showing the distribution of In, Zn, O, and Si in a thin film.

FIG. 14 illustrates a Time-of-Flight Secondary Ion Mass Spectrometry (TOF-SIMS) analysis result showing the distribution of In, Zn, O and Si in the InZnO thin film of the oxide thin-film transistor in accordance with an aspect of the present disclosure.

Referring to FIG. 14, which atoms are present in the InZnO thin film may be investigated by irradiating an ion beam to the InZnO thin film of the oxide thin-film transistor fabricated according to Example 1 and analyzing the masses of atoms bounced by the irradiation.

Figure 15:
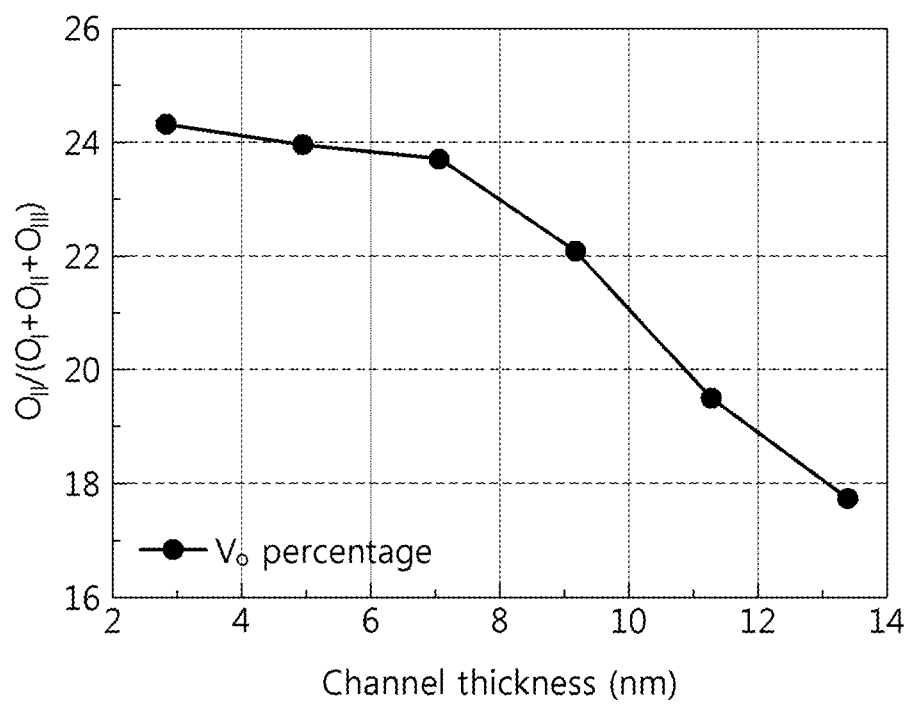
FIGS. 15 and 16 illustrate depth X-ray photoXPS O1s peak analysis results representing oxygen vacancies in a thin film and a change in M-OH/Si—O bonding.
Figure 16:
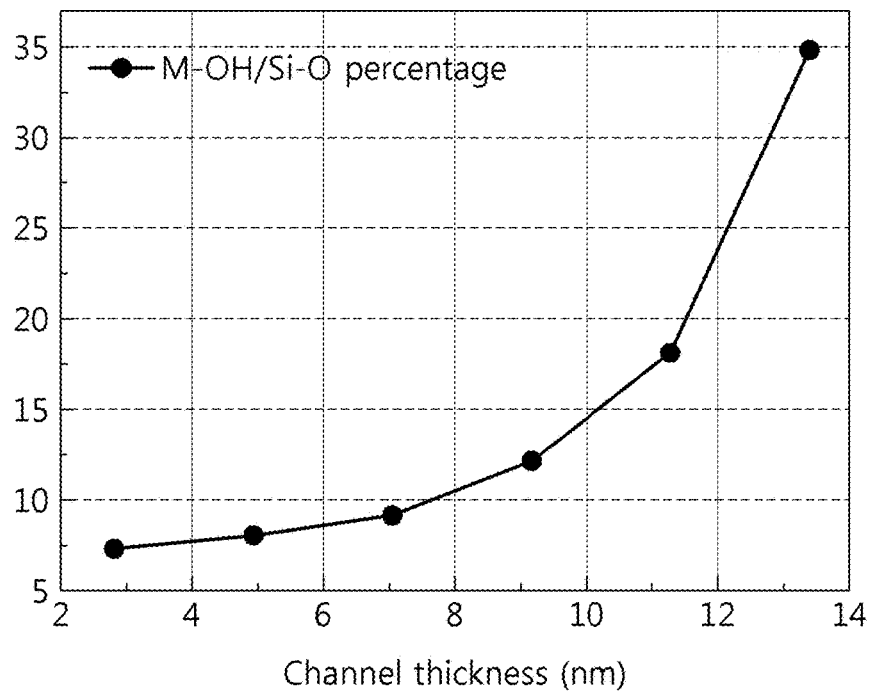

FIGS. 15 and 16 illustrate X-ray Photoelectron Spectroscopy (XPS) analysis results showing oxygen vacancies in an InZnO thin film and a change in M-OH/Si—O bonding of an oxide thin-film transistor in accordance with an aspect of the present disclosure.

Referring FIGS. 15 and 16, the depth profile of the InZnO thin film of the oxide thin-film transistor fabricated according to Example 1 was analyzed through X-ray Photoelectron Spectroscopic analysis. As a result, it can be confirmed that, according to thickness increases of the channel layer, an oxygen vacancies ratio (Vo percentage) decreases and an M-OH/Si—O percentage increases.

Example 2: Homojunction Oxide Thin-Film Transistor Including Channel, Source and Drain Regions <Substrate preparation>, <InZnO solution preparation> and <InZnO thin film formation> are performed using the same method as described in Example 1.

<Photoresist Layer Formation>

After formation of a three-layered InZnO thin film, a photoresist layer was deposited so that the width (W) and length (L) of a channel layer were 300 μm and 15 μm, respectively.

<Channel Layer Formation>

To form a channel layer (i.e., channel region) and source and drain regions by selective wet etching of an InZnO thin film, the fabricated device was subjected to dipping in a 5% diluted acetic acid solution. Etching (or dipping) time was adjusted to 6 minutes.

<Removal of Photoresist Layer>

A photoresist layer was removed by an ashing process using oxygen ($O_2$) plasma.

Hereinafter, referring to FIGS. 17 and 18, the characteristics of a homojunction oxide thin-film transistor according to another aspect of the present disclosure is described.

Figure 17:
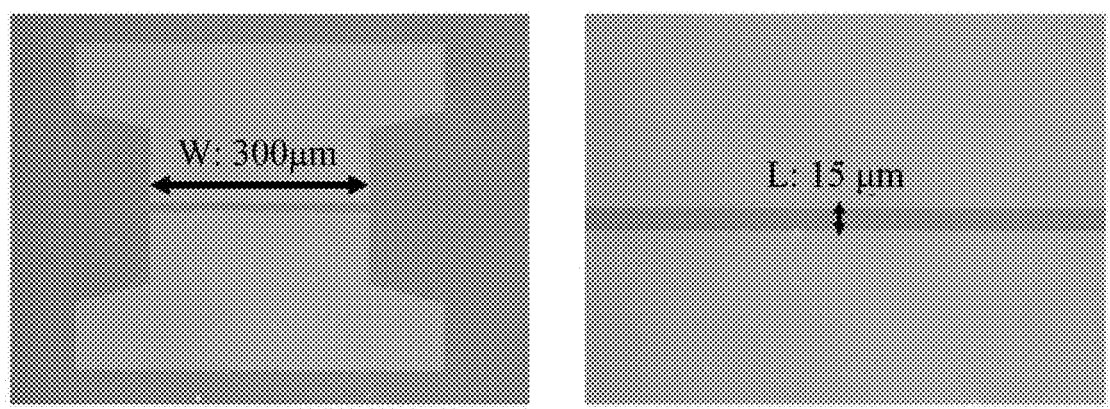
FIG. 17 illustrates optical microscopic (OM) images of a homojunction oxide thin-film transistor according to another aspect of the present disclosure.

FIG. 17 shows optical microscopic (OM) images of a homojunction oxide thin-film transistor according to another aspect of the present disclosure.

In particular, FIG. 17 shows optical microscopy images of an oxide thin-film transistor fabricated by the following process. An InZnO thin film was subjected to patterning using a photoresist layer having a predetermined pattern according to Example 2, selective etching of the InZnO thin film was carried out for 6 minutes, and finally, the photoresist layer was removed.

Referring to FIG. 17, it can be confirmed that the width/length (W/L) of a channel layer is 300/15 μm.

Figure 18:
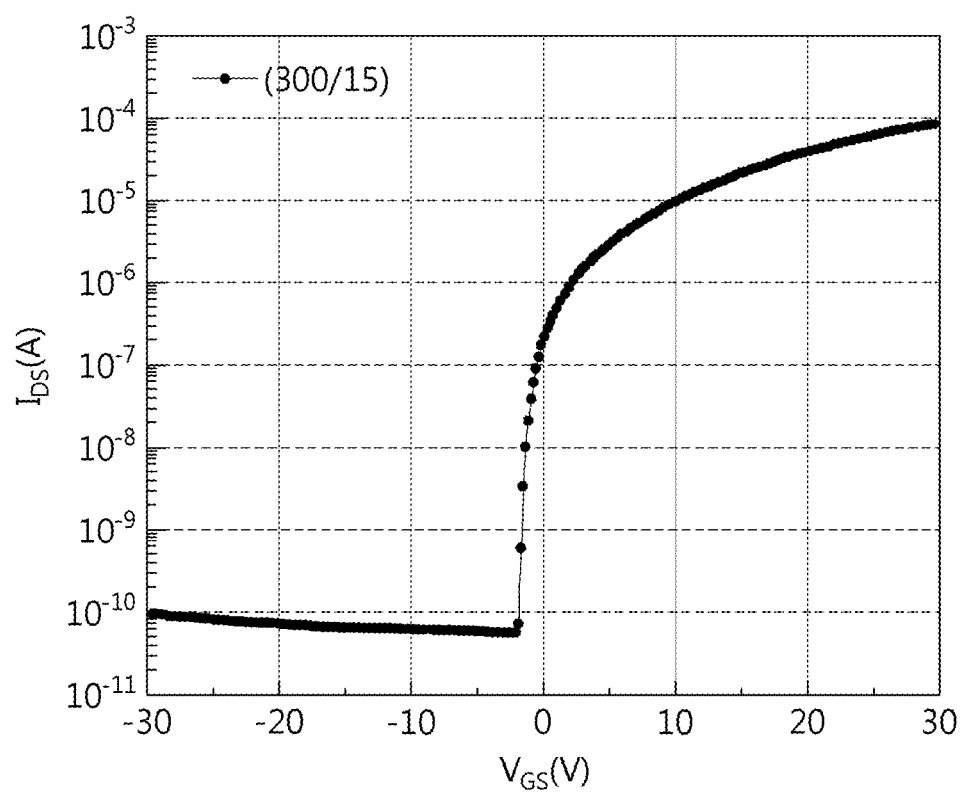
FIG. 18 is a graph illustrating electrical characteristics of a homojunction oxide thin-film transistor according to another aspect of the present disclosure.

FIG. 18 is a graph illustrating the electrical characteristics of a homojunction oxide thin-film transistor according to another aspect of the present disclosure.

In particular, FIG. 18 is a graph showing the electrical characteristics of an oxide thin-film transistor fabricated by the following process. An InZnO thin film was subjected to patterning using a photoresist layer having a predetermined pattern, selective etching of the InZnO thin film was carried out for six minutes, and finally, the photoresist layer was removed.

Referring to FIG. 18, even in the case of an oxide thin-film transistor including an InZnO thin film having channel, source and drain regions, in which patterning was performed by selectively etching the InZnO thin film using a photoresist layer without forming source and drain electrodes separately, the transfer characteristics of an oxide thin-film transistor device was observed.

In addition, the electrical characteristics of an oxide thin-film transistor fabricated according to Example 2 is shown in Table 3 below.

TABLE 3

| Etching time (min) | μFET (cm2/Vs) | Vth (V) | On/Off current ratio | S.S (V/dec) |
|---|---|---|---|---|
| 6 | 0.35 | −2.20 | 152 × 106 | 0.58 |

Referring to Table 3, it can be seen that the electrical characteristics of a device is satisfactorily observed even the case of an oxide thin-film transistor having only an InZnO thin film without separate source and drain electrodes.

As apparent from the above description, since the oxide thin film of the oxide thin-film transistor is formed by a chemical solution deposition process, production costs may be reduced compared to a deposition process.

In addition, according to the embodiment of the present disclosure, since the semiconductorized channel layer is included by selectively etching the oxide thin film, an oxide thin-film transistor having improved electrical characteristics may be fabricated.

In addition, according to the embodiment of the present disclosure, an oxide thin-film transistor enabling to control the thickness of the channel layer by selectively etching the oxide thin film may be fabricated.

Further, according to the embodiment of the present disclosure, since the oxide thin film includes the multi-stack, a high film density is provided, whereby an oxide thin-film transistor having improved electrical characteristics may be fabricated.

Although the present invention has been described through limited examples and figures, the present invention is not intended to be limited to the examples. Those skilled in the art will appreciate that various modifications, additions and substitutions are possible, without departing from the scope and spirit of the invention. Therefore, it should be understood that there is no intent to limit the disclosure to the embodiments disclosed, rather, the disclosure is to cover all modifications, equivalents, and alternatives falling within the spirit and scope of the disclosure as defined by the claims.

What is claimed is:

1. An oxide thin-film transistor, comprising:
a gate electrode formed on a substrate;
a gate insulating layer formed on the gate electrode; and
an oxide thin film formed on the gate insulating layer,
wherein the oxide thin film comprises a channel region, source and drain regions disposed on the channel region and spaced apart from each other, and a concentration profile due to a dopant diffused from the gate insulating layer,
wherein the channel region operates as a channel layer by the concentration profile,
wherein the oxide thin film further comprises an intermediate region above the channel region and below the source and drain regions, and
wherein a concentration of the dopant in the channel region is higher than a concentration of the dopant in the intermediate region, and the concentration of the dopant in the intermediate region is higher than a concentration of the dopant in the source and drain regions.

2. The oxide thin-film transistor according to claim 1, wherein the channel region is distinguished from the source and drain regions and is formed by selective etching to include the concentration profile so as to function as the channel layer.

3. The oxide thin-film transistor according to claim 1, wherein the oxide thin film has a well-shaped recessed pattern by selective etching.

4. The oxide thin-film transistor according to claim 1, wherein a thickness of the channel layer of the oxide thin film is controlled through control of the concentration profile by the selective etching.

5. The oxide thin-film transistor according to claim 1, wherein the concentration profile comprises a concentration gradient from the substrate to an upper part.

6. The oxide thin-film transistor according to claim 1, wherein the oxide thin film comprises multi stacks formed of at least one oxide layer.

7. The oxide thin-film transistor according to claim 1, wherein the oxide thin film is formed of any one selected from the group consisting of InO, ZnO, SnO, InZnO, InGaO, ZnSnO, InSnZnO, and InGaZnO.

8. The oxide thin-film transistor according to claim 1, wherein the oxide thin film is formed on the substrate, followed by annealing.

9. An oxide thin-film transistor, comprising:
a gate electrode formed on a substrate;
a gate insulating layer formed on the gate electrode; and
an oxide thin film formed on the gate insulating layer,
wherein the oxide thin film comprises a channel region, source and drain regions disposed on the channel region and spaced apart from each other, and a concentration profile due to a dopant diffused from the gate insulating layer, and
wherein the gate insulating layer is formed of silicon dioxide ($SiO_2$) and the dopant is silicon (Si).

10. An oxide thin-film transistor, comprising:
a gate electrode formed on a substrate;
a gate insulating layer formed on the gate electrode;
an oxide thin film formed on the gate insulating layer; and source and drain electrodes disposed on the oxide thin film and spaced apart from each other, wherein the oxide thin film comprises a channel region and source and drain regions disposed on the channel region and a concentration profile due to a dopant diffused from the gate insulating layer, wherein the channel region functions as a channel layer by the concentration profile, wherein the oxide thin film further comprises an intermediate region above the channel region and below the source and drain regions, and wherein a concentration of the dopant in the channel region is higher than a concentration of the dopant in the intermediate region, and the concentration of the dopant in the intermediate region is higher than a concentration of the dopant in the source and drain regions.

11. The oxide thin-film transistor according to claim 10, wherein the gate insulating layer is formed of silicon dioxide ($SiO_2$) and the dopant is silicon (Si).

* * * * *